United States Patent [19]
Khieu

[11] Patent Number: 5,381,127
[45] Date of Patent: Jan. 10, 1995

[54] FAST STATIC CROSS-UNIT COMPARATOR
[75] Inventor: Cong Q. Khieu, San Jose, Calif.
[73] Assignee: Intel Corporation, Santa Clara, Calif.
[21] Appl. No.: 172,424
[22] Filed: Dec. 22, 1993
[51] Int. Cl.[6] .................................................. G06F 7/04
[52] U.S. Cl. .................................................. 340/146.2
[58] Field of Search ...................................... 340/146.2
[56] References Cited
U.S. PATENT DOCUMENTS

4,839,841  6/1989  Hagen et al. ................ 340/146.2
4,933,662  6/1990  Szczepanek ................. 340/146.2
5,059,942  10/1991 Burrows ...................... 340/146.2
5,319,348  6/1994  Lee et al. .................... 340/146.2

Primary Examiner—John S. Heyman
Attorney, Agent, or Firm—Blakely, Sokoloff, Taylor & Zafman

[57] ABSTRACT

A high speed, static, BiCMOS comparator circuit. Though static, the circuit operates at nearly dynamic speeds. The circuit consists of two stages. The first stage generates XOR and XNOR outputs given two bit strings. The second stage detects hit and miss separately using the XOR and XNOR inputs. The second stage generates signals for both hit lines and miss lines.

23 Claims, 7 Drawing Sheets

(Prior Art)

FAST STATIC CROSS-UNIT COMPARATOR

FIELD OF THE INVENTION

The present invention relates to the field of integrated logic circuits and more particularly to a BiCMOS circuit.

BACKGROUND OF THE INVENTION

While conventional CMOS (Complementary Metal Oxide Semiconductor) integrated circuit processes may be used to create circuits which consume less power and occupy less space on a semiconductor substrate than similar circuits designed around a bipolar transistor fabrication process, bipolar devices, among other advantages, have the inherent ability to operate at higher speeds, drive larger capacitive loads, and switch faster than their MOS (Metal Oxide Semiconductor) counterparts. In an attempt to capture the advantages of both bipolar and MOS devices in one circuit, a BiCMOS (Bipolar Complementary Metal Oxide Semiconductor) process has been developed.

In a BiCMOS process, bipolar and MOS transistors are both created on a single semiconductor substrate so that a portion of the resulting circuit operates using bipolar transistors while another portion of the same circuit operates using MOS transistors. As a result, one is given the freedom to design and implement a BiCMOS circuit which, among other advantages, consumes very little power, occupies very little space, operates at very high speeds, and can drive large capacitive loads. A circuit such as this would have extensive applications in, for instance, battery-powered notebook computers where power consumption must be minimized in order to prolong battery life, size must be minimized to enhance portability, and processing speeds must be fast enough to handle advanced computational applications.

For demonstration purposes below, we will assume that a low voltage is that voltage which corresponds most closely with one particular logical state while a high voltage is that voltage which corresponds most closely with the opposite logical state in a binary scheme. For example, in a 5 volt CMOS system, a voltage greater than approximately 2.5 V may be considered a logical "1", and a voltage less than approximately 2.5 V may be considered a logical "0". Of course, this correspondence may be reversed such that a low voltage represents a logical "1" and a high voltage represents a logical "0". In an alternate system which operates with a 3 V supply, for example, a voltage greater than approximately 1.5 V may be considered a logical "1", and a voltage less than approximately 1.5 V may be considered a logical "0". Of course, this correspondence may again be reversed. In general, the lower supply voltage (which is simply ground in many applications) plus one-half the difference between the upper supply voltage minus the lower supply voltage of any system may be considered the approximate boundary between high and low voltages or alternate logical states for demonstration purposes herein.

A comparator is a circuit which compares two pieces of data and determines if they are equal. A comparator generally accepts two bit strings at its input and compares each bit position in the first bit string to the equivalent bit position in the second bit string. If the bits contained at each bit position in the first bit string are equivalent to each corresponding bit position in the second bit string, then the comparator detects a "hit" and produces the necessary output which communicates that hit to the rest of the device. If any bit in the first bit string is not identical to the corresponding bit in the second bit string, then the comparator detects a "miss" and produces the necessary output which communicates that miss to the rest of the device.

Figure 1:
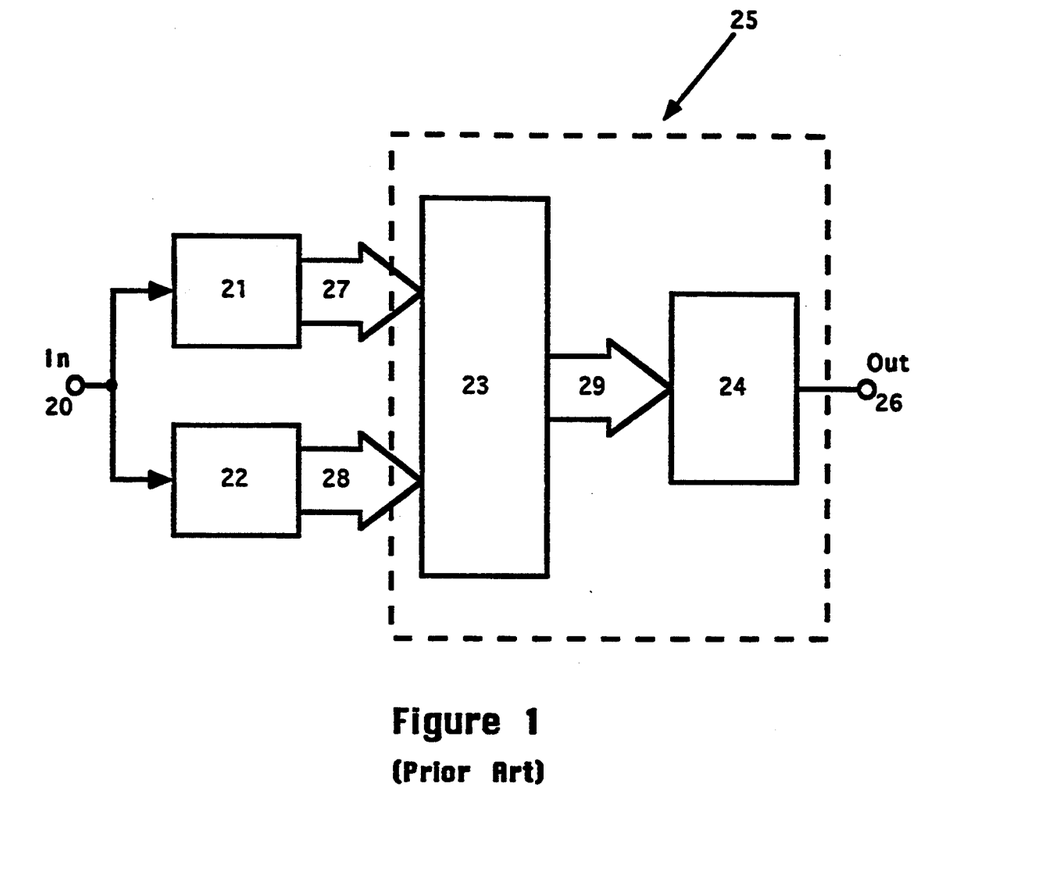
FIG. 1 is an illustration of a cross-unit comparator application.

FIG. 1 illustrates a typical application of a cross-unit comparator in a system. A signal is generated at the input 20 which triggers two relatively independent circuits (or units), 21 and 22, to process information. The comparator circuit 25 is then used to determine whether the data produced by circuit 21 is the same as the data produced by circuit 22. While the two circuits 21 and 22 may be simultaneously triggered, all of the output data 27 of circuit 21 will not likely reach the comparator circuit 25 at the same time that all of the output data 28 of circuit 22 reaches the comparator circuit 25. The output 27 of circuit 21 may reach the comparator circuit 25 well before, well after, or partially before and partially after the output 28 of circuit 22 reaches the comparator. There are many reasons for this.

One mason the output 27 of circuit 21 and the output 28 of circuit 22 may not reach the comparator circuit simultaneously is simply due to the inherent differences in the speed of the two circuits, 21 and 22, as a result of their differing design and operation. Another reason may be that circuit 21 is controlled by a different clock having different timings than the clock controlling circuit 22. Or, perhaps, the length of the bus line carrying output data 27 from circuit 21 to the comparator circuit 25 is much different than the length of the bus line carrying output data 28 from circuit 22 to the comparator circuit 25. In such a case, RC delay may significantly contribute to differences in arrival time of the data to the comparator circuit 25.

Typically, dynamic circuits are capable of operating at higher speeds than their static circuit counterparts. However, if the comparator circuit 25 is to be implemented as a dynamic circuit, enough delay margin must be added to the dynamic circuit so that it is not triggered until the comparator circuit 25 has fully received both inputs 27 and 28. If the proper delay margin is not added, the dynamic circuit may be prematurely tripped which may cause erroneous output at node 26 from which the dynamic circuit cannot recover. Therefore, it is necessary to determine the worst case, slowest arrival time in receiving both signals 27 and 28 at the input of comparator circuit 25 and design the dynamic circuit to allow triggering only after such a delay margin has been added. Unfortunately, it is not always possible to determine or detect the arrival time of the signals 27 and 28 accurately.

For instance, it may become necessary to design the comparator circuit 25 before or concurrently with designing the circuits 21 or 22. In such a case it would be impossible to complete a comparator circuit 25 until both circuit blocks 21 and 22 have been completed and simulated in order to determine what the delay margin should be for the comparator circuit 25. Also, even if the circuits 21 and 22 are simulated, there is no guarantee that they will physically perform in the same manner in which the simulation predicts. In addition, depending on the layout pattern ultimately used in the circuit, RC delay may not be properly accounted for in the delay of comparator circuit 25.

Furthermore, if comparator circuit 25 is initially designed as a dynamic circuit which accounts for the arrival time of input data 28 which is initially known to arrive after input data 27, it is possible that over the lifetime of the device, circuit 21 may be stressed more heavily than circuit 22 causing circuit 21 to become slower than circuit 22 due to stress effects such as electromigration and hot electron injection. Alternately, circuit 22 may become much slower than was originally accounted for due to stress of circuit 22 over the lifetime of the device. The result is that delay margins that were originally added to the comparator circuit 25 will become inadequate over time leading to long term device failure. Also, delay margin must be added to a dynamic circuit in order to account for noise on the input lines which occurs soon after the input lines are switched. Noise can cause a dynamic circuit to prematurely trigger. Therefore a delay margin is added to be sure the dynamic circuit does not read the input signal until the input line has settled. It is very difficult to predict the amount of noise which will appear on an input line without actually measuring it. Therefore, the amount of delay margin added to a dynamic circuit due to predicted input noise must be very conservative.

For the above reasons, it becomes either impossible or impracticable to use a dynamic circuit for cross-unit comparator applications. If a dynamic circuit is used in such an application, it would require so much delay time margin that the resulting circuit would end up being slower than an equivalent static circuit. Static circuits, while generally slower in operation than dynamic circuits, do not require delay margins because a static circuit can recover from input signal noise and delayed inputs. A static circuit simply switches its output in real time to account for any switches at its input. A static circuit need not be reset because its output always reflects the logical result of signals applied to its input at any instant in time. For this reason, a static circuit may not only be faster than an equivalent dynamic circuit (once reasonable delays are added to the dynamic circuit) but also the static circuit may be designed only once for a particular cross-unit comparator application, and the same static circuit can be placed into any other similar comparator application with minimal redesigning regardless of the expected arrival times of the inputs in either application. Because the delay margin added to a dynamic comparator circuit in one application may be too much or too little for use in another application, one can not simply "pick and place" the same dynamic circuit in both applications. The circuit must be redesigned to specifically suit each individual application.

Finally, an ECL current sensing approach may be used to solve the problem associated with determining arrival times of inputs to a cross-unit comparator. However, such an approach is also not practicable because the outputs of ECL circuits are small signals. These small signals need to undergo ECL to CMOS translation in order for such circuits to be able to communicate with the CMOS logic used elsewhere in the device. Unfortunately, an ECL-CMOS translator adds significant delay to the circuit such that the ECL current sensing approach becomes too slow to be reasonably implemented in an advanced processor.

If the comparator circuit 25 of FIG. 1 is to be designed as a static circuit, the first stage of the circuit may be a standard XNOR gate 23. The XNOR gate 23 is actually a series of XNOR circuits arranged such that each XNOR circuit accepts one bit of data from input bit string 27 along with the corresponding bit of data from input bit string 28 and performs an XNOR function on the two bits to generate a result ("1" if the bits are the same, "0" if the bits are different). There are as many XNOR circuits in XNOR gate 23 as there are pairs of bits in the bit strings to be compared. So the output 29 of the XNOR gate is a single word in which each bit position represents the equivalent bit position in inputs 27 and 28, and is a 1 if the bit in the equivalent bit position in input bit string 27 is the same as the bit in the equivalent bit position in input bit string 28 and 0 if not. Therefore, when input bit string 27 is equal to input bit string 28, the resultant bit string 29 will consist solely of a string of 1's.

Block 24 in FIG. 1 is a miss detection circuit. The purpose of the miss detection circuit 24 is to determine if any of the bits in input bit string 29 are a 0. If any of the bits in input bit string 29 are a 0, this indicates that the equivalent bit positions in input bit strings 27 and 28 are not equal to each other, and hence, the bit string 27 is not equal to the bit string 28. If such is the case, miss detection circuit 24 will output a 1 indicating to the rest of the device that the two bit strings 27 and 28 from units 21 and 22 respectively do not match. Of course, an alternate interpretation is that miss detection circuit 24 determines whether or not all of the bits in input bit string 29 are 1. If all of the bits in input bit string 29 are 1, then bit string 27 is equal to bit string 28 and the miss detection circuit will transmit a 0 at output 26.

Figure 2:
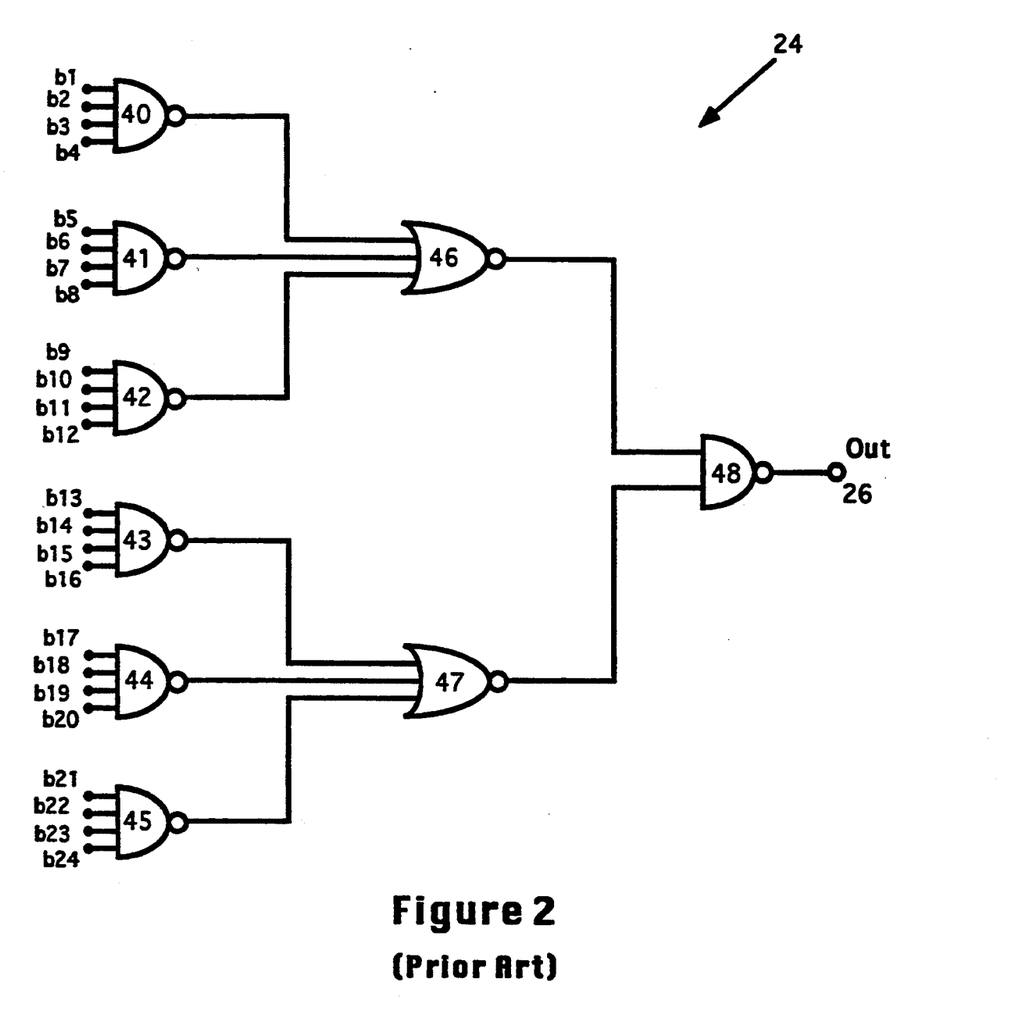
FIG. 2 is an illustration of a prior art miss detection circuit.

A conventional, static miss detection circuit 24 for use in the operation of the system of FIG. 1 is shown in FIG. 2. This miss detection circuit is equivalent to a single, large NAND gate. This particular miss detection circuit has a 24 bit input labelled $b_1, b_2, b_3 \ldots b_{23}, b_{24}$. In the first stage of the miss detection circuit of FIG. 2, bits 1-4 are input to NAND gate 40, bits 5-8 are input to NAND gate 41, bits 9-12 are input to NAND gate 42, bits 13-16 are input to NAND gate 43, bits 17-20 are input to NAND gate 44, and bits 21-24 are input to NAND gate 45. In the second stage of the miss detection circuit of FIG. 2, the outputs of NAND gates 40, 41, and 42 are coupled to the input of NOR gate 46 while the outputs of NAND gates 43, 44, and 45 are coupled to the input of NOR gate 47. Finally, in the third stage of the miss detection circuit, the outputs of NOR gates 46 and 47 are coupled to the input of NAND gate 48. The output of NAND gate 48 appears on output node 26.

Each of the 24 bit inputs $b_1, b_2, b_3 \ldots b_{23}, b_{24}$ of FIG. 2 corresponds to the respective bit position in a 24 bit XNOR gate output 29 in FIG. 1. So, for instance, the bit value at bit position $b_3$ in FIG. 2 will be a 1 if the bit value at the third bit position in the 24 bit input string 27 is equal to the bit value at the third bit position in the 24 bit input string 28. And the bit value at bit position $b_3$ will be a 0 of the bits in the respective bit positions in bit strings 27 and 28 are not equal to each other. NAND gates 40, 41, 42, 43, 44, and 45 will only output a 0 if all four of their respective inputs are 1's. NOR gates 46 and 47 will only output a 1 if all three of their respective inputs are 0's. NAND gate 48 will only output a 0 at output node 26 if both of its inputs are 1's.

The result is that if any of the 24 bits present at the input to this miss detection circuit are a 0, indicating that the two bit strings being compared by the comparator circuit are not equal to each other at the respective bit position, then the first corresponding NAND gate will output a 1, the next corresponding NOR gate will output a 0 and the final NAND gate 48 will output a 1 at output node 26 indicating a miss. On the other hand, if every one of the 24 bits is a 1, indicating that the two bit strings being compared by the comparator circuit are equal to each other at every bit position, then the first six NAND gates 40–45 will all output 0's, the next two NOR gates 46 and 47 will both output 1's and the final NAND gate 48 will output a 0 at output node 26 indicating a hit.

Figure 3:
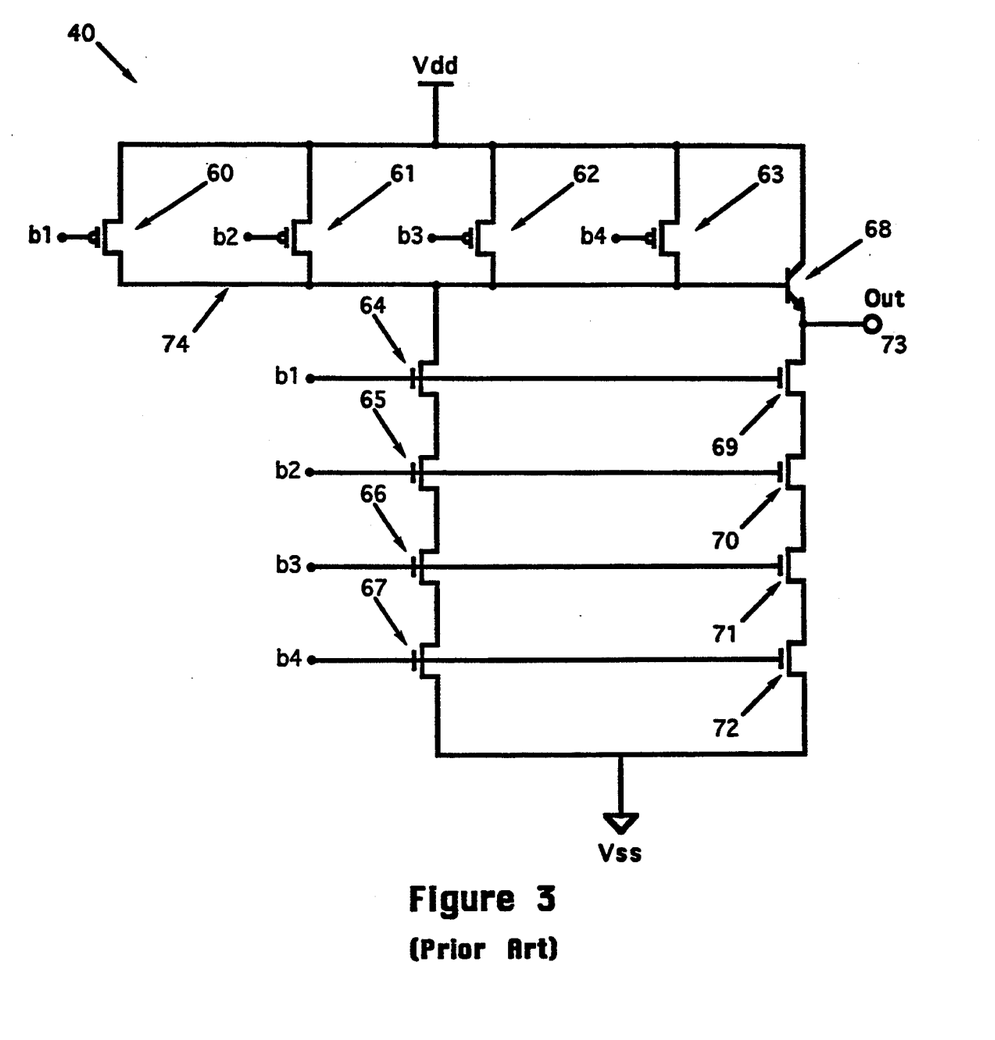
FIG. 3 is an illustration of a prior art NAND gate circuit.

The reason a single, large NAND gate cannot be used to replace the multiple stage miss detection circuit of FIG. 2 is because the 24 bit input to the miss detection circuit far exceeds the fan-in limit of a conventional static NAND gate. Conventional static NAND gates are used in the miss detection circuit of FIG. 2, and the circuit diagram for NAND gate 40 is shown in FIG. 3. In FIG. 3 it can be seen that PMOS transistors 60, 61, 62, and 63 are connected in parallel such that the sources of these transistors are tied to Vdd while the drains of these transistors are coupled to base line 74. The gates of each of transistors 60, 61, 62, and 63 are controlled by the voltages corresponding to each of inputs $b_1$, $b_2$, $b_3$, and $b_4$ respectively. Base line 74 is coupled to the base of bipolar transistor 68 while the collector of bipolar transistor 68 is tied to Vdd and its emitter is coupled to output 73.

NMOS transistors 64, 65, 66, and 67 are connected in series with one another such that the drain of transistor 64 is coupled to base line 74 at one end of the series while the source of transistor 67 is tied to Vss at the other end of the series. The source of transistor 64 is coupled to the drain of transistor 65. The source of transistor 65 is coupled to the drain of transistor 66. The source of transistor 66 is coupled to the drain of transistor 67. The gates of each of NMOS transistors 64, 65, 66, and 67 are controlled by the voltages corresponding to each of inputs $b_1$, $b_2$, $b_3$, and $b_4$ respectively. In similar fashion, NMOS transistors 69, 70, 71, and 72 are connected in series with one another such that the drain of transistor 69 is coupled to the output 73 at one end of the series while the source of transistor 72 is tied to Vss at the other end of the series. The source of transistor 69 is coupled to the drain of transistor 70. The source of transistor 70 is coupled to the drain of transistor 71. The source of transistor 71 is coupled to the drain of transistor 72. The gates of each of NMOS transistors 69, 70, 71, and 72 are controlled by the voltages corresponding to each of inputs $b_1$, $b_2$, $b_3$, and $b_4$ respectively.

The BiCMOS NAND gate 40 of FIG. 3 is representative of all the other NAND gates 41, 42, 43, 44, 45, and 48 in FIG. 2. Each of the four inputs $b_1$, $b_2$, $b_3$, and $b_4$ controls the operation of three transistors. Transistors 60, 61, 62, and 63 are p-channel transistors (PMOS), so in order for the supply voltage Vdd to be applied to the base of transistor 68, thereby pulling output 73 high, one of inputs $b_1$, $b_2$, $b_3$, or $b_4$ must be at a low voltage. On the other hand, if all of the inputs $b_1$, $b_2$, $b_3$, and $b_4$ are at a high voltage, supply voltage Vdd will not be able to reach the base of transistor 68 through any of transistors 60, 61, 62, or 63, and all n-channel transistors (NMOS) 64, 65, 66, 67, 69, 70, 71, and 72 will turn on thereby pulling base line 79 of transistor 68 low (turning it off) as well as output node 73.

There are several problems with this type of a logic circuit. First, note that output node 73 is pulled down by transistors 69, 70, 71, and 72 in series, and base line 74, coupled to the base node of transistor 68, is pulled down by transistors 64, 65, 66, and 67 in series. It can take a long time for a series connection of MOS transistors to charge or discharge a node. The more MOS transistors appearing in series between the node to be pulled down (discharged) and Vss, the slower the device switching speed of pulling down that node. Likewise, the more MOS transistors appearing in series between the node to be pulled up (charged) and Vdd, the slower the device switching speed of pulling up that node.

If one were to expand the circuit of FIG. 3 from a four input NAND gate to, for instance, a six input NAND gate, two additional p-channel transistors would appear in parallel with transistors 60, 61, 62, and 63 between Vdd and base line 74, two additional n-channel transistors would appear in series with transistors 64, 65, 66, and 67 between base line 74 and Vss, and two additional n-channel transistors would appear in series with transistors 69, 70, 71, and 72 between the output node 73 and Vss. Therefore, as the NAND circuit of FIG. 3 expands to accept more inputs, the number of MOS transistors appearing in series to pull down base line 74 and the output node 73 increases proportionately thereby slowing down the circuit's switching speed as discussed above. There comes a point when too many inputs incorporated into the circuit of FIG. 3 will either wholly frustrate the circuit's ability to sufficiently pull down the output node 73, or will make the device too slow to be practical. This is known as the fan-in limit and is typically about four inputs for a NAND circuit like the one depicted in FIG. 3.

Even with four inputs to NAND circuit 40, this circuit will still be too slow for advanced processing operations. Miss detection circuit 24 of FIG. 2 has three stages, six NAND gates in the first stage, two NOR gates in the second stage, and one NAND gate in the third stage. Since miss detection circuit 24 has multiple stages, execution of the second stage must be delayed until it is certain that all its inputs have been properly received from the first stage. Likewise, execution of the third stage must be delayed until it is certain that all its inputs have been properly received from the second stage. The only way to ensure that all the inputs to a stage have been received is to add enough delay margin to each stage so that even the worst-case (slowest) delay in propagation of data through a previous stage will be accounted for in a subsequent stage.

For NAND circuit 40, the worst-case delay in propagation of data through the gate will be when inputs $b_1$, $b_2$, $b_3$, and $b_4$ simultaneously switch from low to high voltages. When this occurs, output node 73 will only switch from a high to a low voltage once all the charge on base line 74 has been drained through series NMOS transistors 64, 65, 66, and 67 thereby turning off bipolar transistor 68. Since these NMOS transistors 64, 65, 66, and 67 collectively add quite a bit of resistance to the path between base line 74 and Vss, it will take a long time to drain all the charge from base line 74. Once the bipolar transistor 68 is no longer driving output node 73, the charge on output node 73 must be drained through series NMOS transistors 69, 70, 71, and 72. Again, since the series connection of NMOS transistors contributes to the resistance path to Vss, it will take a long time to drain all the charge from output node 73.

So each of NAND gates 40–45 may be expected to operate very slowly whenever all four of each respective NAND gates' inputs simultaneously switch from low to high. In a similar manner, NOR gates 46 and 47 may be expected to operate very slowly whenever all three of each respective NOR gates' inputs simultaneously switch. The switching speed or NAND gate 48 doesn't experience as much of a delay because it has only two inputs. The ultimate result is that the first and second stage of miss detection circuit 24 each contribute the equivalent of two gate delays to the overall miss detection circuit 24, while the final stage contributes only one gate delay (due to fewer inputs). So miss detection circuit 24 contributes a total of 5 gate delays to the comparator circuit 25 of FIG. 1.

SUMMARY OF THE PRESENT INVENTION

A high speed, BiCMOS cross-unit comparator circuit is described. In order to improve the speed of the circuit, hit and miss are detected separately by a hit-miss detection portion of the comparator circuit so that each path has been fully optimized. The hit-miss detection circuit may be split into any number of smaller units, each unit accepting a portion of the total number of bits to be compared. Each of these small units may then be wire-ORed together. This allows for the modularity of the comparator circuit in that the basic circuit need not be redesigned to accommodate differing bit string length applications or layout constraints. The comparator circuit is a static circuit so it is well suited for cross-unit comparison applications where it is difficult or impossible to detect or know the arrival time of the bit strings to be compared. The hit-miss detection circuit executes within a single gate delay and operates at dynamic-equivalent speeds of approximately 1 ns at 2.7 V/120° C. Reverse bias base-emitter voltage stress on the pull-up bipolar transistor is reduced by providing circuitry to raise the base voltage of the reverse biased bipolar transistor in order to improve the reliability of the circuit. Circuitry is also included to provide approximately full voltage swing on the output. Such a comparator circuit is well suited for use to determine if a probe tag differs from a stored tag in a memory system or for address transition detection applications.

DETAILED DESCRIPTION OF THE PRESENT INVENTION

A high speed, static BiCMOS cross-unit comparator circuit is described which incorporates the use of a single stage hit-miss detection circuit capable of executing within a single gate delay. In the following description, numerous specific details such as device types, voltage levels, circuit configurations, etc., are set forth in order to provide a more thorough understanding of the present invention. It will be obvious, however, to one skilled in the art, that the present invention may be practiced without employing these specific details. In other instances, well-known circuit design techniques and operations have not been described in detail in order not to unnecessarily obscure the present invention.

While diagrams representing a preferred embodiment of the present invention are illustrated in FIGS. 4, 5, 6 and 7, these illustrations are not intended to limit the invention. The specific circuits described herein are only meant to help clarify one's understanding of the present invention and to illustrate particular embodiments in which the present invention may be implemented. It will be appreciated by one skilled in the art that the broader spirit and scope of the present invention, as set forth in the appended claims, can be applied to any type of circuit which seeks the performance achievements attained by the present invention.

Figure 4:
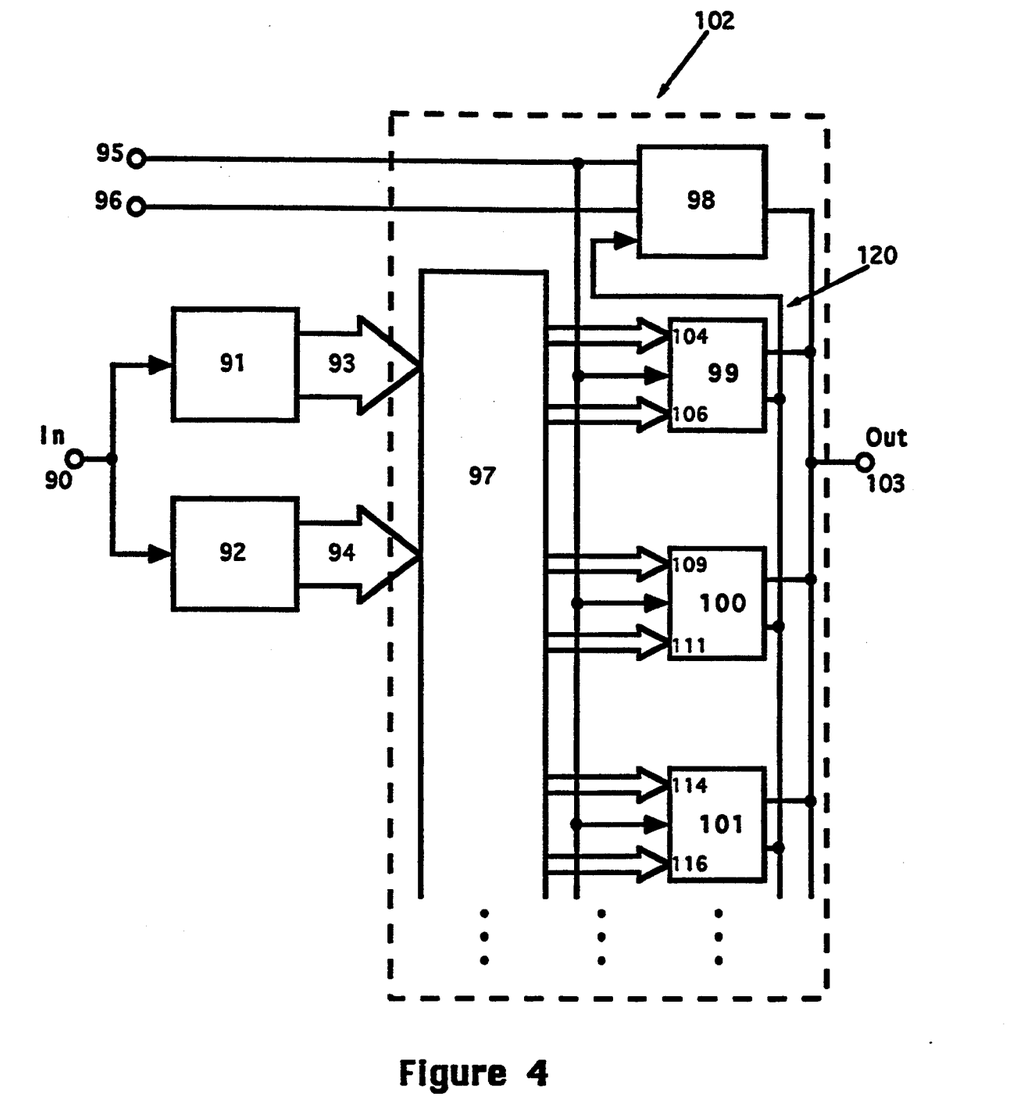
FIG. 4 is an illustration of a cross-unit comparator application consistent with the present invention.

FIG. 4 block diagram illustrating the present invention. A signal is generated at input 90 which triggers two relatively independent circuits, 91 and 92, to process information. The comparator circuit 102 is then used to determine whether the data 93 produced by circuit 91 is the same as the data 94 produced by circuit 92. The comparator circuit 102 comprises two stages. The first stage is a combined XOR/XNOR gate 97. This XOR/XNOR gate 97 is actually a series of XOR/XNOR circuits arranged such that each XOR/XNOR circuit accepts one bit of data from input bit string 93 along with the corresponding bit of data from input bit string 94 and performs and XOR/XNOR function on the two bits to generate two results. In a preferred embodiment of the present invention, the XOR output of each XOR/XNOR circuit produces a 1 which corresponds to a high voltage when the input bits are different, and a 0 which corresponds to a low voltage when the input bits are the same. The XNOR output of each XOR/XNOR circuit produces a 1 which corresponds to a high voltage when the input bits are the same, and a 0 which corresponds to a low voltage when the input bits are different. In an alternate embodiment of the present invention, alternate logic may be used in which case a logical 1 may correspond to a low voltage while a logical 0 may correspond to a high voltage. In such embodiments, the circuits described below should be properly adjusted to accommodate.

Block 99 in FIG. 4 represents a hit-miss detection circuit. This circuit accepts all or at least a portion of the XNOR output of the XOR/XNOR gate 97 at input 104, and all or at least a portion of the XOR output of the XOR/XNOR gate 97 at input 106. Likewise, hit-miss detection circuit 100 accepts at least a portion of the XNOR output of the XOR/XNOR gate 97 at input 109, and at least a portion of the XOR output of the XOR/XNOR gate 97 at input 111. Finally, hit-miss detection circuit 101 accepts at least a portion of the XNOR output of the XOR/XNOR gate 97 at input 114, and at least a portion of the XOR output of the XOR/XNOR gate 97 at input 116. Thus the output of the XOR/XNOR gate 97 may be distributed among one or more hit-miss detection circuits whereby each hit-miss detection circuit accepts a predetermined portion of the total number of XNOR bits and a predetermined portion of the total number of XOR bits. The total number of XOR bits is equal to the number of XNOR bits accepted by each hit-miss detection circuit.

In the preferred embodiment of the present invention, only a single hit-miss detection circuit is employed to handle the entire output of the XOR/XNOR gate 97.

However, two hit-miss detection circuits may be used wherein each hit-miss detection circuit handles, for example, half the total number of XOR/XNOR bits generated by the XOR/XNOR gate 97. By using multiple hit-miss detection circuits in this manner, the total number of MOS transistors appearing on each base line of the pull-up and pull-down bipolar transistors of the hit-miss detection circuits (described below) can be reduced. For example, by distributing the total number of XOR/XNOR bits among two smaller hit-miss detection circuits rather than one larger hit-miss detection circuit, the number of MOS transistors appearing on the base lines of the pull-up and pull down bipolar transistors of each of the two smaller hit-miss detection circuits is effectively cut in half. Since these MOS transistors tend to slow the switching speed of the pull-up and pull down bipolar transistors by contributing capacitive loading to the base lines of the bipolar transistors, reducing the number of MOS transistors appearing on these base lines may improve the speed of the circuit. In alternate embodiments of the present invention, in which layout or device operation constraints further limit the size of the hit-miss detection circuit, three or more hit-miss detection circuits may be used which accept different portions of the data stream generated by the XOR/XNOR gate 97.

Output line 103 is the miss line which is coupled to the upper outputs of the hit-miss detection circuits and the output of enabling circuit 98. Therefore, output 103 goes high when input bit string 93 is not equal to input bit string 94. Output 103 goes low when input bit string 93 is equal to input bit string 94. Line 120 is coupled to the lower outputs of the hit miss detection circuits and to the lower input to enabling circuit 98. Line 120 represents the hit line. Therefore, line 120 goes high when input bit string 93 is equal to input bit string 94, and hit line 120 goes low when input bit string 93 is not equal to input bit string 94.

An enabling circuit 98 may be implemented which accepts active low 95 and active high 96 inputs to control the comparator. These inputs are used to activate and deactivate the comparator circuit. In addition, the enabling circuit 98 includes circuitry to clamp output 103 to Vcc when a hit is detected, and to clamp output 103 to Vss when a hit is detected thereby providing full voltage swing at output 103. In alternate embodiments of the present invention, the enabling circuit may not require active low and active high control lines to turn the comparator on and off. Furthermore, it may not be necessary to implement full voltage swing on output miss line 103. In still alternate embodiments of the present invention, the enabling circuit may be entirely designed around by incorporating the important aspects of the enabling circuit within the hit-miss detection circuit or circuits. Note that active low input 95 is also coupled to the center inputs of the hit-miss detection circuits.

Figure 5:
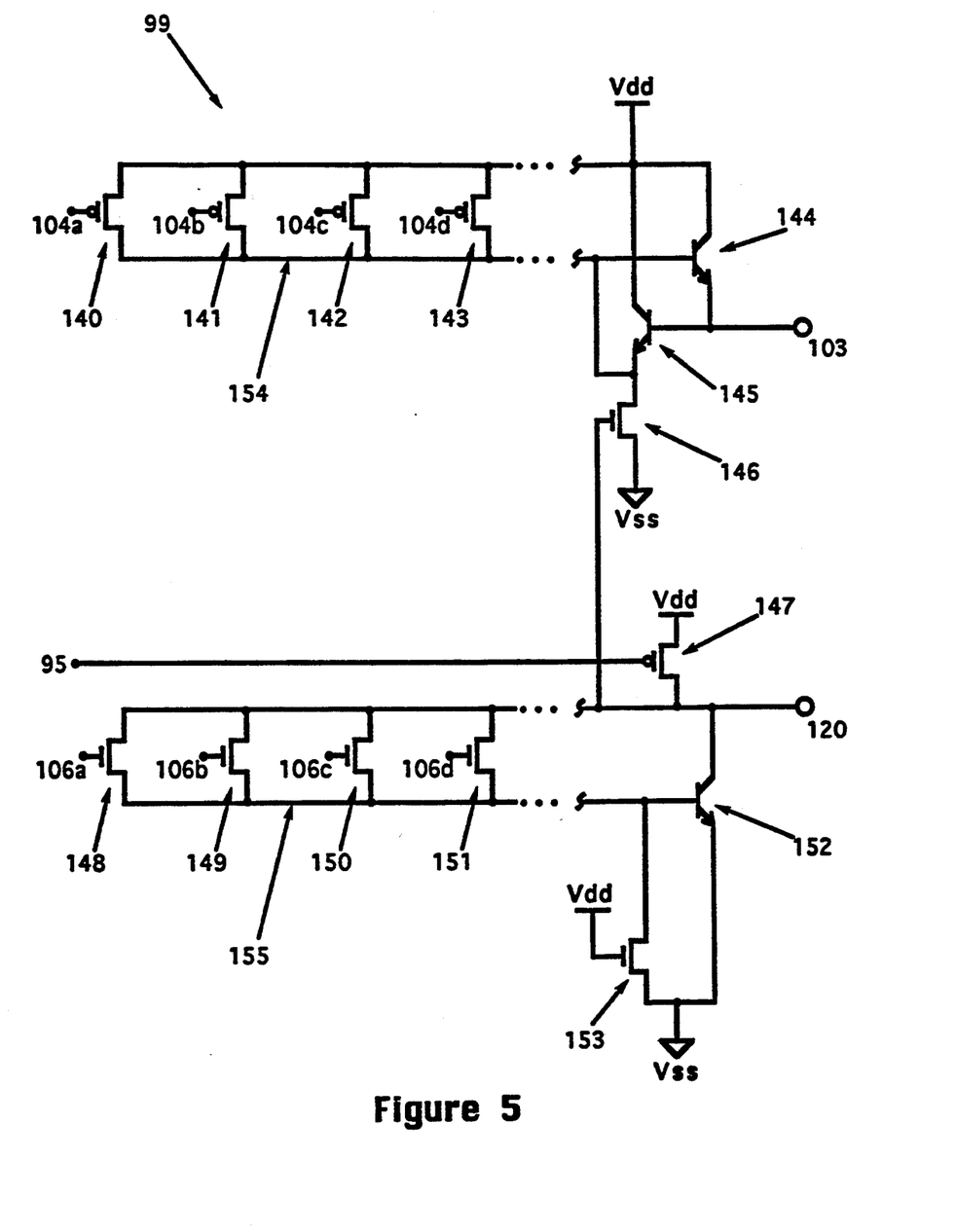
FIG. 5 is an illustration of a hit-miss detection circuit consistent with the present invention.

A preferred embodiment of hit-miss detection circuit 99 is shown in FIG. 5. The XNOR input bus line seen coupling the XOR/XNOR gate 97 to input 104 of hit-miss detection circuit 99 in FIG. 4 can now be seen as the multiple inputs 104a, 104b, 104c, 104d, . . . in FIG. 5. Also, the XOR input bus line seen coupling the XOR/XNOR gate 97 to input 106 of hit-miss detection circuit 99 in FIG. 4 can now be seen as the multiple inputs 106a, 106b, 106c, 106d, . . . in FIG. 5. In a preferred embodiment of the present invention, XNOR input 104 and XOR input 106 may include bit string lengths of anywhere from one to thirty-two bits but may be as high as 64. In alternate embodiments of the present invention, the hit-miss detection circuit of FIG. 5 may either be expanded to accommodate additional inputs, or additional hit-miss detection circuits may be added in the manner shown in FIG. 4 to accommodate additional inputs.

In a preferred embodiment of the present invention, for each bit of data in XNOR input bit string 104, a PMOS transistor is added in parallel to the circuit of FIG. 5 such that the source of the transistor is coupled to Vdd and the drain of the transistor is coupled to the base line 154 of bipolar transistor 144 in the same manner PMOS transistors 140, 141, 142, and 143 are connected. The voltage corresponding to each bit of data in XNOR input bit string 104 is used to control the gate of each respective PMOS transistor just as the voltage corresponding to bit #1 controls the gate of PMOS transistor 140 at input 104a; the voltage corresponding to bit #2 controls the gate of PMOS transistor 141 at input 104b; the voltage corresponding to bit #3 controls the gate of PMOS transistor 142 at input 104c; and the voltage corresponding to bit #4 controls the gate of PMOS transistor 143 at input 104d.

Likewise, for each bit of data in XOR input bit string 106, an NMOS transistor is added in parallel to the circuit of FIG. 5 such that the drain of the transistor is coupled to the drain of transistor 147 and the source of the transistor is coupled to base line 155 of bipolar transistor 152 in the same manner NMOS transistors 148, 149, 150, and 151 are connected. The voltage corresponding to each bit of data in XOR input bit string 106 is used to control the gate of each respective NMOS transistor just as the voltage corresponding to bit #1 controls the gate of NMOS transistor 148 at input 106a; the voltage corresponding to bit #2 controls the gate of NMOS transistor 149 at input 106b; the voltage corresponding to bit #3 controls the gate of NMOS transistor 150 at input 106c; and the voltage corresponding to bit #4 controls the gate of NMOS transistor 151 at input 106d.

At the upper portion of hit-miss detection circuit 99, which is the miss detect portion of the circuit, it can be seen that the collector of bipolar transistor 144 is coupled to Vdd while the emitter of bipolar transistor 144 is coupled to output miss line 103. The base of bipolar transistor 144 is coupled to the base line 154 which carries the drains of parallel PMOS transistors 140, 141, 142, 143, . . . as well as the emitter of bipolar transistor 145. The sources of parallel PMOS transistors 140, 141, 142, 143, . . . are tied to Vdd. Miss line 103 is coupled to the base of bipolar transistor 145 while the collector of bipolar transistor 145 is tied to Vdd. The emitter of bipolar transistor 145 is coupled to the drain of NMOS transistor 146 and the source of transistor 146 is tied to Vss. The gate of NMOS transistor 146 is coupled to output hit line 120.

At the lower portion of hit-miss detection 99, which is the hit detect portion of the circuit, it can be seen that the source of PMOS transistor 147 is tied to Vdd while its drain is coupled to the output hit line 120. The gate of transistor 147 is controlled by the active low control line 95. The collector of bipolar transistor 152 is coupled to hit line 120, its emitter is tied to Vss, and its base is coupled to base line 155 which carries the sources of parallel NMOS transistors 148, 149, 150, 151, . . . , as well as the drain of NMOS transistor 153. The drains of parallel NMOS transistors 148, 149, 150, 151, . . . are coupled to output 120. The gate of NMOS transistor 153 is tied to Vdd while its source is tied to Vss.

Figure 6:
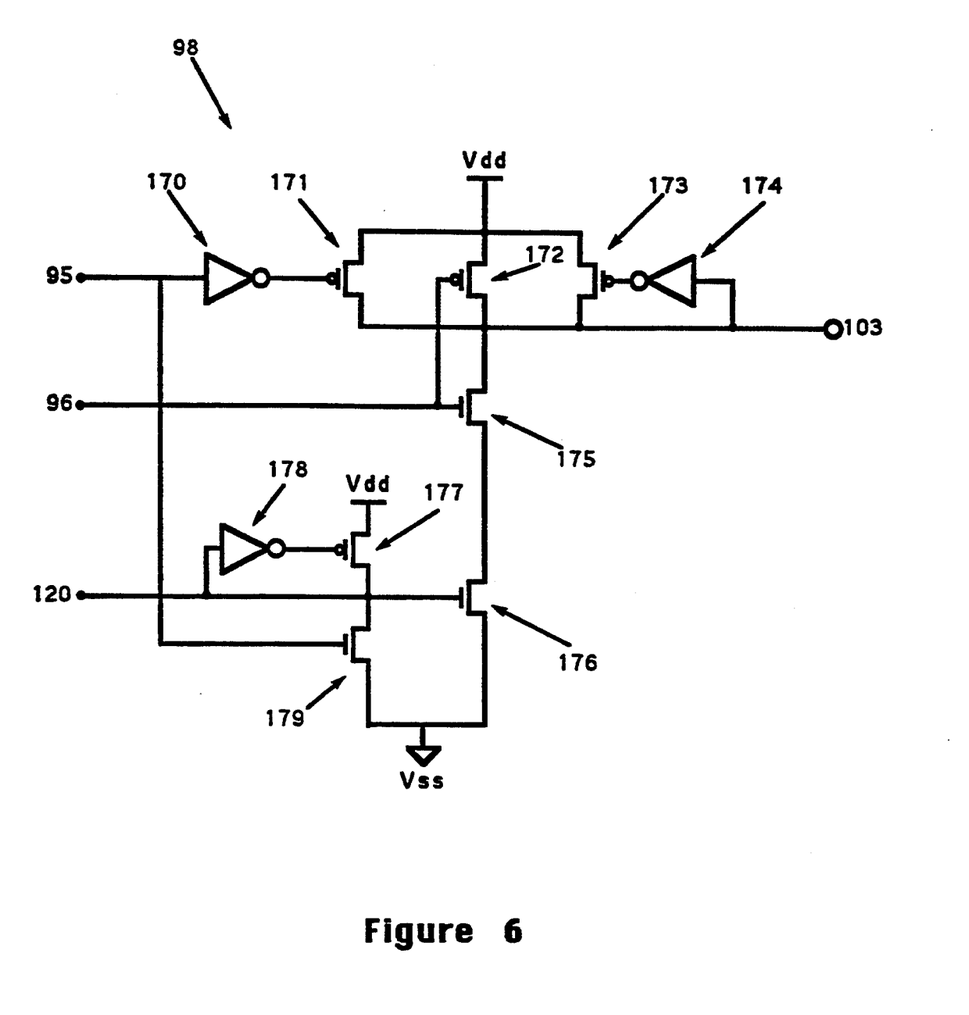
FIG. 6 is an illustration of an enabling circuit consistent with the present invention.

To fully understand the operation of hit-miss detection circuit 99, it is necessary to analyze the hit-miss detection circuit in conjunction with enabling circuit 98 shown in FIG. 6. Enabling circuit 98 accepts the active low control line 95 as well as the active high control line 96 at its input. In addition, the lower input 120 to the enabling circuit is hit line 120. The output 103 of the enabling circuit is the miss line 103. Active low control line 95 is coupled to the input of inverter 170 whose output is coupled to the gate of PMOS transistor 171. The source of PMOS transistor 171 is tied to Vdd while its drain is coupled to output miss line 103. PMOS transistors 172 and 173 are connected in parallel to PMOS transistor 171 so that their sources are also tied to Vdd while their drains are coupled to miss line 103. The gate of PMOS transistor 172 is coupled to active high control line 96, and the gate of PMOS transistor 173 is coupled to the output of inverter 174 whose input is coupled to output miss line 103. The drain of NMOS transistor 175 is also coupled to miss line 103, and its source is coupled to the drain of NMOS transistor 176. The gate of NMOS transistor 175 is coupled to active high control line 96. The source of transistor 176 is tied to Vss. Hit line 120 is coupled to the input to inverter 178, the drain of PMOS transistor 177, the drain of NMOS transistor 179, and the gate of NMOS transistor 176. The source of PMOS transistor 177 is tied to Vdd while its gate is coupled to the output of inverter 178. The gate of NMOS transistor 179 is coupled to active low control line 95 while its source is tied to Vss.

In a preferred embodiment of the present invention, when bit string 93 appearing at the input to comparator circuit 102 of FIG. 4 is not equal to bit string 94 appearing at the input to comparator circuit 102, the first-stage XOR/XNOR circuit will generate a low voltage at the corresponding differing bit position or positions at its XNOR output and a high voltage at the corresponding differing bit position or positions at its XOR output. Assuming that the differing bit position is contained within the portion of bits accepted by hit-miss detection circuit 99, the result is that at least one of the PMOS transistor gates coupled to input 104 will go low and at least one of the NMOS transistor gates coupled to input 106 will go high.

For example, in FIG. 4, if the bit in the third bit position of input bit string 93 differs from the bit in the third bit position of input bit string 94, the portion of the bus line corresponding to the third bit position of the XNOR output of XOR/XNOR gate 97 will be at a low voltage while the portion of the bus line corresponding to the third bit position of the XOR output of the XOR/XNOR gate 97 will be at a high voltage. If, for example, at least the first three XOR/XNOR bit positions are detected by hit-miss detection circuit 99, shown in FIG. 5, then PMOS transistor 142 will turn on assuming its gate at 104c is coupled to the third bit position of the bus line of the XNOR output of the XOR/XNOR gate 97 of FIG. 4. Likewise, NMOS transistor 150 will also turn on assuming its gate at 106c is coupled to the third bit position of the bus line of the XOR output of XOR/XNOR gate 97 of FIG. 4.

Referring to FIG. 5 and assuming active low line 95 is low and active high line 96 is high, since transistor 142 turns on, the base of transistor 144 will be pulled up to Vdd, turning it on. Transistor 144 will then pull output 103, coupled to the emitter of transistor 144, high. As output miss line 103 is being raised, so rises the voltage on the input to inverter 174 of FIG. 6. The output to this inverter will lower the voltage on the gate of PMOS transistor 173, turning it on. The drain of PMOS transistor 173 is also coupled to miss line 103. Bipolar transistor 144 of FIG. 5 is only capable of raising output 103 to Vdd-Vbe, where Vbe is the voltage drop between the base and emitter of the bipolar transistor (generally, Vbe is approximately 0.8 V). Transistor 173 along with inverter 174 in enabling circuit 98, however, serves to pull miss line 103 the rest of the way up to approximately Vdd.

Referring to FIG. 5, since NMOS transistor 150 turns on and PMOS transistor 147 is on, assuming hit line 120 was previously charged up to Vdd, this charge will be applied through transistor 150 to the base of bipolar transistor 152 turning it on. Bipolar transistor 152 will pull output 120 down to Vbe which is approximately 0.8 volts. Although PMOS transistor 147 will still be on, it will not be able to pull up hit line 120 because PMOS transistor 147 is a small dimension, weak, static transistor which cannot overcome the charge draining capability of bipolar transistor 152. Since hit line 120 will be low, transistor 146 will be off thereby isolating the high voltage on miss line 103 from Vss.

if bit string 93 matches bit string 94, then every bit line at input 104 of hit-miss detection circuit 99 will be high and every bit line at input 106 of hit-miss detection circuit 99 will be low. Looking at FIG. 5 it can be seen that if all of inputs 104a, 104b, 104c, 104d, ... are high, then all of the respective PMOS transistors will be off. This will essentially isolate the base of bipolar transistor 144 from Vdd thereby allowing its base and emitter to be drained of charge. Also, since all of inputs 106a, 106b, 106c, 106d, ... are low, all of the respective NMOS transistors will be off. This will isolate the base of bipolar transistor 152 from hit line 120. The charge on the base of bipolar transistor 152 will drain through transistor 153 (used as a resistor) and will turn off transistor 152. Small static charge-up transistor 147 will then raise the voltage on hit line 120 from Vbe to the voltage necessary to trip inverter 178 of enabling circuit 98. In a three volt operating system, this trip point may be approximately 1.2 volts. Therefore, small transistor 147 need only charge hit line 120 a mere 0.4 volts (from 0.8 to 1.2 volts) before the inverter 178 turns on large transistor 177 and drives the hit line the rest of the way to approximately Vdd very quickly.

When hit line 120 goes high, transistor 176 will be turned on which will pull miss line 103 (through transistor 175 in FIG. 6) down to Vss thereby providing full voltage swing on miss line 103 from approximately Vdd in a high state (through PMOS transistor 173 as described above) to approximately Vss in a low state (through NMOS transistor 176). Inverter 174 coupled to miss line 119 will turn off PMOS transistor 173. Since hit line 120 will be pulled high, transistor 146 in the miss detect portion of hit-miss detection circuit 99 will turn on thereby draining the charge from the base of bipolar transistor 144. In this manner, hit-miss detection circuit 99 switches very quickly. In fact, the static hit-miss detection circuit of FIG. 5 has demonstrated switching speeds of approximately 1 ns at 2.7 V/120° C. which is comparable to equivalent dynamic circuits.

In an alternate embodiment of the present invention, duplicates of PMOS transistors 140, 141, 142, 143, ... appearing in parallel in the miss detect portion of hit-miss detection circuit 99 are added in parallel with the NMOS transistors in the hit detect portion of the circuit. In this embodiment, each of transistors 140, 141, 142, 143, . . . , in addition to appearing in parallel between Vdd and base line 154, appear in parallel with transistors 148, 149, 150, 151, . . . between hit line 120 and base line 155. The gates of these additional PMOS transistors in the hit detect portion of the circuit are controlled by the same signals controlling each of the respective PMOS transistors in the miss detect portion of the circuit (104a, 104b, 104c, 104d, . . . respectively in this example). One reason one may wish to construct the hit-miss detection circuit in such a manner is to reduce problems associated with capacitive coupling of the gates of transistors 148, 149, 150, 151, etc. to hit line 120. When a hit is detected, and the voltages applied to gates coupled to input 106 switch low simultaneously, capacitive coupling between hit line 120 and the transistor gates may cause the voltage on hit line 120 to dip below 0.8 volts (Vbe). When this happens, small static charge-up transistor 147 must work harder to charge hit line 120 back up to the trip point. This significantly slows down the circuit since transistor 147 is relatively slow in charging up hit line 120 due to its small size. By adding the PMOS transistors as described above, the gates on these transistors will switch high at the same time the gates on the NMOS transistors will switch low. Capacitive coupling between the PMOS transistor gates and hit line 120 will tend to raise the voltage on hit line 120. The net effect if both PMOS and NMOS transistors appear in parallel on hit line 120 is that the capacitive coupling of PMOS transistors cancels the capacitive coupling of NMOS transistors and hit line 120 will remain at 0.8 volts. Since these PMOS transistors may tend to trap charge on base line 155, the NMOS transistors additionally serve to allow charge on base line 155 to drain up through hit line 120 and back down through bipolar transistor 152 when bipolar transistor 152 turns on.

For each bit line a hit-miss detection circuit carries, an additional transistor is added to the respective base line. In the situation where, for instance, two hit-miss detection circuits structurally identical to the single hit-miss detection circuit shown in FIG. 5 are connected as shown in FIG. 4, it is necessary that if either hit-miss detection circuit detects a miss, then the miss detect output 103 of the comparator circuit 102 of FIG. 4 must be high (indicating a miss). Steady state conditions for a hit (when bit string 93 is equal to bit string 94) and a miss (when bit string 93 is not equal to bit string 94) are described above. If, for example, hit-miss detection circuit 99 detects a hit, all of transistors 148, 149, 150, 151, . . . will be turned off thereby turning off transistor 152. Weak PMOS transistor 147 will then attempt to charge up hit line 120. But if hit line 120 is coupled to the analogous output of an alternate, identical, hit-miss detection circuit which detects a miss, weak PMOS transistor 147 will not be able to charge up hit line 120 because any charge which transistor 147 places on hit line 120 will be drained through the strong bipolar transistor of the alternate circuit which is equivalent to transistor 152 of the circuit shown. Therefore, output line 108 will remain low indicating a miss on hit line 120.

Since hit line 120 will remain low, transistor 146 will be off. Since all of the transistors 140, 141, 142, 143, . . . are off, bipolar transistor 144 will be off. But since miss line 103 is coupled to the analogous output of an alternate, identical hit-miss detection circuit which detects a miss, output miss line 103 will be driven high by the pull-up transistor of the alternate circuit which is equivalent to transistor 144 of the circuit shown indicating a miss. Note that transistor 145 has been added to hit-miss detection circuit 99 to prevent reverse biasing of transistor 144.

Reverse or negative bias across the pn base-emitter junction of bipolar transistor 144 is a reliability concern. Reverse biasing a base-emitter junction causes hot electron injection in the transistor. This can result in the creation of base-emitter leakage current and a drop in transistor gain which is a function of the base-emitter reverse bias stress voltage and stress time. This leakage current and drop in transistor gain degrades the performance of the bipolar transistor thereby degrading the performance of the entire circuit. Thus, the reliability of the microprocessor in which the circuit operates, and indeed the reliability of the entire computer system in which such a microprocessor resides, is jeopardized by such reverse biasing of the base-emitter junction of the bipolar transistor.

In the example given above in which the output miss line 103 is raised to Vdd, bipolar transistor 145, whose base is coupled to output miss line 103 is activated. The high voltage on the base of transistor 145 is fed back through its emitter (with a minor drop of Vbe) to the base of transistor 144. In this manner, the base of transistor 144 is raised to a voltage roughly equivalent to the voltage appearing at the emitter of transistor 144 thereby significantly reducing or eliminating any reverse bias voltage appearing across the base-emitter junction of transistor 144. Note that the base voltage of bipolar transistor 144 need not exactly match the emitter voltage of transistor 144 in order to significantly reduce the reverse bias voltage across the base-emitter junction of transistor 144. For instance, in the present example, the voltage at the base of bipolar transistor 144 will actually be slightly less than the voltage at the emitter of transistor 144 due to the voltage drop through bipolar transistor 145. Also, transistor 145 prevents reverse bias when the emitter of transistor 144 is discharged too fast.

Figure 7:
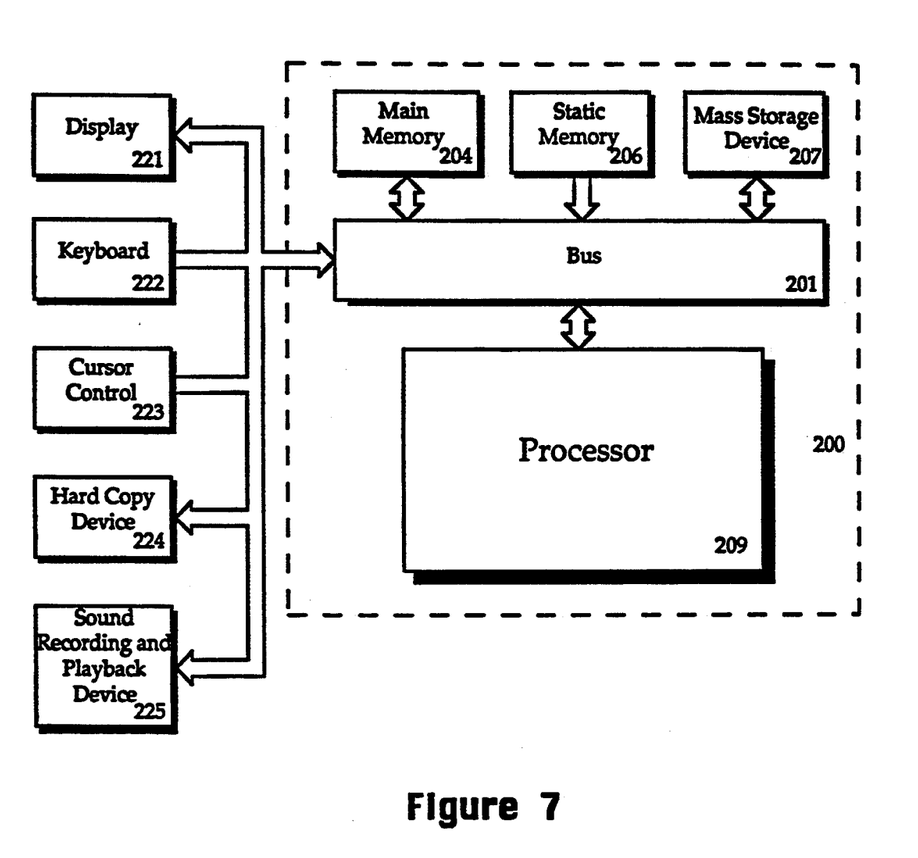
FIG. 7 is an illustration of an implementation of the present invention in a computer system.

A circuit of the type described herein may be used in a processor in conjunction with a computer system. Referring to FIG. 7, the computer system upon which a the present invention can be implemented is shown as 200. Computer system 200 comprises a bus or other communication means 201 for communicating information, and a processing means 209 coupled with bus 201 for processing information. System 200 further comprises a random access memory (RAM) or other dynamic storage device 204 (referred to as main memory), coupled to bus 201 for storing information and instructions to be executed by processor 209. Main memory 204 also may be used for storing temporary variables or other intermediate information during execution of instructions by processor 209. Computer system 200 also comprises a read only memory (ROM) and/or other static storage device 206 coupled to bus 201 for storing static information and instructions for processor 209. Data storage device 207 is coupled to bus 201 for storing information and instructions.

A data storage device 207 such as a magnetic disk or optical disk and its corresponding disk drive can be coupled to computer system 200. Computer system 200 can also be coupled via bus 201 to a display device 221, such as a cathode ray tube (CRT), for displaying information to a computer user. An alphanumeric input device 222, including alphanumeric and other keys, is typically coupled to bus 201 for communicating information and command selections to processor 209. Another type of user input device is cursor control 223, such as a mouse, a trackball, or cursor direction keys for communicating direction information and command selections to processor 209 and for controlling cursor movement on display 221. This input device typically has two degrees of freedom in two axes, a first axis (e.g., x) and a second axis (e.g., y), which allows the device to specify positions in a plane.

Another device which may be coupled to bus 201 is a hard copy device 224 which may be used for printing instructions, data, or other information on a medium such as paper, film, or similar types of media. Additionally, computer system 200 can be coupled to a device for sound or video recording and/or playback 225 such as an audio or video digitizer coupled to a microphone or camera for recording information. Further, the device may include a speaker which is coupled to a digital to analog (D/A) converter for playing back digitized sounds. Finally, computer system 200 can be a terminal in a computer network (e.g., a LAN).

A circuit of the type described herein may be used in a processor in conjunction with memory systems such as a cache, other buffer memory location, RAM, ROM, a latch, or any register to determine if a probe tag differs from a stored tag. In addition, the present circuit may be used in address transition detection (ATD) applications. Because the present circuit is static yet operates at dynamic-equivalent speeds, the present invention is particularly well suited for cross-unit applications.

Thus, a novel, high speed, BiCMOS cross-unit comparator circuit has been described which may be implemented in numerous applications with little or no redesign work required. Specific implementations of such a circuit have been described.

It is claimed:

1. A static comparator circuit capable of operating at high speeds while consuming very little power, said comparator circuit comprising:
   a first stage accepting a first bit string and a second bit string, said first stage generating a first output, said first output comprising a plurality of voltages corresponding to an XOR function applied to at least a portion of said first bit string and an equivalent portion of said second bit string, said first stage also generating a second output, said second output comprising a plurality of voltages corresponding to an XNOR function applied to at least a portion of said first bit string and an equivalent portion of said second bit string; and
   a second stage comprising a hit-miss detection circuit, said hit-miss detection circuit comprising a hit line and a miss line, said hit-miss detection circuit further comprising NMOS transistors having NMOS transistor gates and PMOS transistors having PMOS transistor gates, each of said NMOS transistor gates and each of said PMOS transistor gates being controlled by each of said first plurality of voltages and each of said second plurality of voltages respectively, said NMOS transistors being connected in parallel to each other and said PMOS transistors being connected in parallel to each other such that when any one of said NMOS transistor gates goes high and any one of said PMOS transistor gates goes low, said hit line is pulled down and said miss line is pulled up.

2. The comparator circuit of claim 1 wherein said hit-miss detection circuit further comprises a first bipolar transistor whose emitter is coupled to said miss line for use in pulling up said miss line.

3. The comparator circuit of claim 2 further comprising protection circuitry for raising a base voltage appearing at a base of said first bipolar transistor from a low base voltage to a higher base voltage when an emitter voltage appearing at an emitter of said first bipolar transistor switches from a low emitter voltage to a high emitter voltage thereby reducing or eliminating a reverse bias voltage appearing across a base-emitter junction of said first bipolar transistor.

4. The comparator circuit of claim 2 further comprising circuitry to provide approximately full voltage swing on said miss line.

5. The comparator circuit of claim 1 wherein said hit-miss detection circuit further comprises a second bipolar transistor whose collector is coupled to said hit line for use in pulling down said hit line.

6. The comparator circuit of claim 5 further comprising circuitry to pull said hit line up to approximately Vdd.

7. The comparator circuit of claim 1 wherein said hit line is at least partially charged high by a static charge-up, MOS transistor.

8. The comparator circuit of claim 1 wherein said second stage comprises a plurality of said hit-miss detection circuits, each of said hit-miss detection circuits accepting different portions of said first plurality of voltages and said second plurality of voltages.

9. The comparator circuit of claim 3 wherein said second stage comprises a plurality of said hit-miss detection circuits, each of said hit-miss detection circuits accepting different portions of said first plurality of voltages and said second plurality of voltages.

10. The comparator circuit of claim 6 wherein said second stage comprises a plurality of said hit-miss detection circuits, each of said hit-miss detection circuits accepting different portions of said first plurality of voltages and said second plurality of voltages.

11. The comparator circuit of claim 1 wherein said comparator circuit is used to determine if a probe tag differs from a stored tag in a memory system.

12. A computer system comprising:
   a memory for storage of information;
   a processor coupled to said memory for manipulation of said information;
   said processor including a comparator circuit;
   said comparator circuit comprising a first stage accepting a first bit string and a second bit string, said first stage generating a first output, said first output comprising a first plurality of voltages corresponding to an XOR function applied to at least a portion of said first bit string and an equivalent portion of said second bit string, said first stage also generating a second output, said second output comprising a second plurality of voltages corresponding to an XNOR function applied to at least a portion of said first bit string and an equivalent portion of said second bit string; and
   said comparator circuit additionally including a second stage, said second stage comprising a hit-miss detection circuit, said hit-miss detection circuit comprising a hit line and a miss line, said hit-miss detection circuit further comprising NMOS transistors having NMOS transistor gates and PMOS transistors having PMOS transistor gates, each of said NMOS transistor gates and each of said PMOS transistor gates being controlled by voltages corresponding to each of said first plurality of voltages and each of said second plurality of voltages respectively, said NMOS transistors being connected in parallel to each other and said PMOS transistors being connected in parallel to each other such that when any one of said NMOS transistor gates goes high and any one of said PMOS transistor gates goes low, said hit line is pulled down and said miss line is pulled up.

13. The computer system of claim 12 wherein said hit-miss detection circuit further comprises a first bipolar transistor whose emitter is coupled to said miss line for use in pulling up said miss line.

14. The computer system of claim 13 further comprising protection circuitry for raising a base voltage appearing at a base of said first bipolar transistor from a low base voltage to a higher base voltage when an emitter voltage appearing at an emitter of said first bipolar transistor switches from a low emitter voltage to a high emitter voltage thereby reducing or eliminating a reverse bias voltage appearing across a base-emitter junction of said first bipolar transistor.

15. The computer system of claim 13 further comprising circuitry to provide approximately full voltage swing on said miss line.

16. The computer system of claim 12 wherein said hit-miss detection circuit further comprises a second bipolar transistor whose collector is coupled to said hit line for use in pulling down said hit line.

17. The computer system of claim 16 further comprising circuitry to pull said hit line up to approximately Vdd.

18. The computer system of claim 12 wherein said hit line is at least partially charged high by a static charge-up, MOS transistor.

19. The computer system of claim 12 wherein said second stage comprises a plurality of said hit-miss detection circuits, each of said hit-miss detection circuits accepting different portions of said first plurality of voltages and said second plurality of voltages.

20. The computer system of claim 14 wherein said second stage comprises a plurality of said hit-miss detection circuits, each of said hit-miss detection circuits accepting different portions of said first plurality of voltages and said second plurality of voltages.

21. The computer system of claim 17 wherein said second stage comprises a plurality of said hit-miss detection circuits, each of said hit-miss detection circuits accepting different portions of said first plurality of voltages and said second plurality of voltages.

22. The computer system of claim 12 wherein said comparator circuit is used to determine if a probe tag differs from a stored tag in said memory.

23. A method of comparing a first bit string to a second bit string to determine if they are the same, said method comprising:

generating a first plurality of voltages corresponding to an XOR function applied to at least a portion of said first bit string and an equivalent portion of said second bit string;

generating a second plurality of voltages corresponding to an XNOR function applied to at least a portion of said first bit string and an equivalent portion of said second bit string; and generating a hit signal and a miss signal on a hit line and a miss line, respectively, by controlling each of a plurality of gates of a plurality of NMOS transistors using each of said first plurality of voltages and controlling each of a plurality of gates of a plurality of PMOS transistors using each of said second plurality of voltages, said plurality of NMOS transistors being connected in parallel to each other and said plurality of PMOS transistors being connected in parallel to each other such that when any one of said NMOS transistor gates goes high and any one of said PMOS transistor gates goes low, said hit line is pulled down and said miss line is pulled up.

* * * * *

UNITED STATES PATENT AND TRADEMARK OFFICE
CERTIFICATE OF CORRECTION

PATENT NO. : 5,381,127
DATED : January 10, 1995
INVENTOR(S) : Cong Q. Khieu

It is certified that error appears in the above-indentified patent and that said Letters Patent is hereby corrected as shown below:

In column 2 at line 24 delete "mason" and insert --reason--

In column 7 at line 3 delete "or" and insert --of--

In column 12 at line 26 delete "if" and insert --If--

Signed and Sealed this

Twenty-ninth Day of April, 1997

*Attest:*

BRUCE LEHMAN

*Attesting Officer*   *Commissioner of Patents and Trademarks*